US009786762B2

(12) United States Patent
Yamaguchi et al.

(10) Patent No.: US 9,786,762 B2
(45) Date of Patent: Oct. 10, 2017

(54) GATE ELECTRODE OF A SEMICONDUCTOR DEVICE, AND METHOD FOR PRODUCING SAME

(71) Applicant: PS4 Luxco S.a.r.l., Luxembourg (LU)

(72) Inventors: Hiromu Yamaguchi, Tokyo (JP); Kazuaki Tonari, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/424,943

(22) PCT Filed: Aug. 22, 2013

(86) PCT No.: PCT/JP2013/073073
§ 371 (c)(1),
(2) Date: Feb. 27, 2015

(87) PCT Pub. No.: WO2014/034748
PCT Pub. Date: Mar. 6, 2014

(65) Prior Publication Data
US 2015/0263124 A1    Sep. 17, 2015

(30) Foreign Application Priority Data
Aug. 29, 2012    (JP) .................................. 2012-188780

(51) Int. Cl.
*H01L 29/78*    (2006.01)
*H01L 29/51*    (2006.01)
(Continued)

(52) U.S. Cl.
CPC ...... *H01L 29/517* (2013.01); *H01L 21/02164* (2013.01); *H01L 21/02172* (2013.01); *H01L 21/02667* (2013.01); *H01L 21/28079* (2013.01); *H01L 21/28088* (2013.01); *H01L 21/28525* (2013.01); *H01L 21/28568* (2013.01);
(Continued)

(58) Field of Classification Search
None
See application file for complete search history.

(56) References Cited

U.S. PATENT DOCUMENTS 5,236,869 A    8/1993    Takagi et al.
8,314,022 B1 *  11/2012   Foster .............. H01L 21/31111
                                                    257/E21.219
(Continued)

FOREIGN PATENT DOCUMENTS

CN    1463045 A    12/2003
CN    1812103 A    8/2006
(Continued)

OTHER PUBLICATIONS

International Search Report (ISR) (PCT Form PCT/ISA/210), in PCT/JP2013/073073, dated Dec. 10, 2013.

*Primary Examiner* — Minh-Loan Tran
(74) *Attorney, Agent, or Firm* — Kunzler Law Group, PC

(57) ABSTRACT

A semiconductor device includes a semiconductor substrate; a gate insulating film provided on the semiconductor substrate; a gate electrode having a metal layer, a metal oxide layer and a silicon layer containing a dopant, provided sequentially on the gate insulating film; and a transistor having a gate insulating film and a gate electrode.

17 Claims, 13 Drawing Sheets

(51) Int. Cl.
  *H01L 29/49* (2006.01)
  *H01L 21/8238* (2006.01)
  *H01L 21/8234* (2006.01)
  *H01L 21/02* (2006.01)
  *H01L 21/28* (2006.01)
  *H01L 21/285* (2006.01)

(52) U.S. Cl.
  CPC ............ *H01L 21/82345* (2013.01); *H01L 21/823828* (2013.01); *H01L 29/495* (2013.01); *H01L 29/4958* (2013.01); *H01L 29/4966* (2013.01); *H01L 29/513* (2013.01)

(56) References Cited

U.S. PATENT DOCUMENTS

| | | |
|---|---|---|
| 2001/0025995 A1 | 10/2001 | Lee et al. |
| 2003/0222318 A1 | 12/2003 | Tanaka et al. |
| 2006/0131622 A1 | 6/2006 | Yamada et al. |
| 2009/0152636 A1* | 6/2009 | Chudzik ........... H01L 21/82384 257/369 |
| 2010/0291765 A1 | 11/2010 | Nakajima |
| 2012/0153401 A1* | 6/2012 | Javorka ............. H01L 21/82341 257/392 |
| 2013/0056833 A1 | 3/2013 | Takeoka |

FOREIGN PATENT DOCUMENTS

| | | |
|---|---|---|
| EP | 499249 A2 | 8/1992 |
| JP | 04-259242 A | 9/1992 |
| JP | 2001-223177 A | 8/2001 |
| JP | 2003-347543 A | 12/2003 |
| JP | 2006-173370 A | 6/2006 |
| JP | 2010-267678 A | 11/2010 |
| JP | 2012-064695 A | 3/2012 |
| JP | 2012-104735 A | 5/2012 |
| JP | 2012-231071 A | 11/2012 |
| KR | 10-2001-0076839 A | 8/2001 |
| KR | 10-2005-0037546 A | 4/2005 |
| WO | WO 2012/035679 A1 | 3/2012 |

* cited by examiner

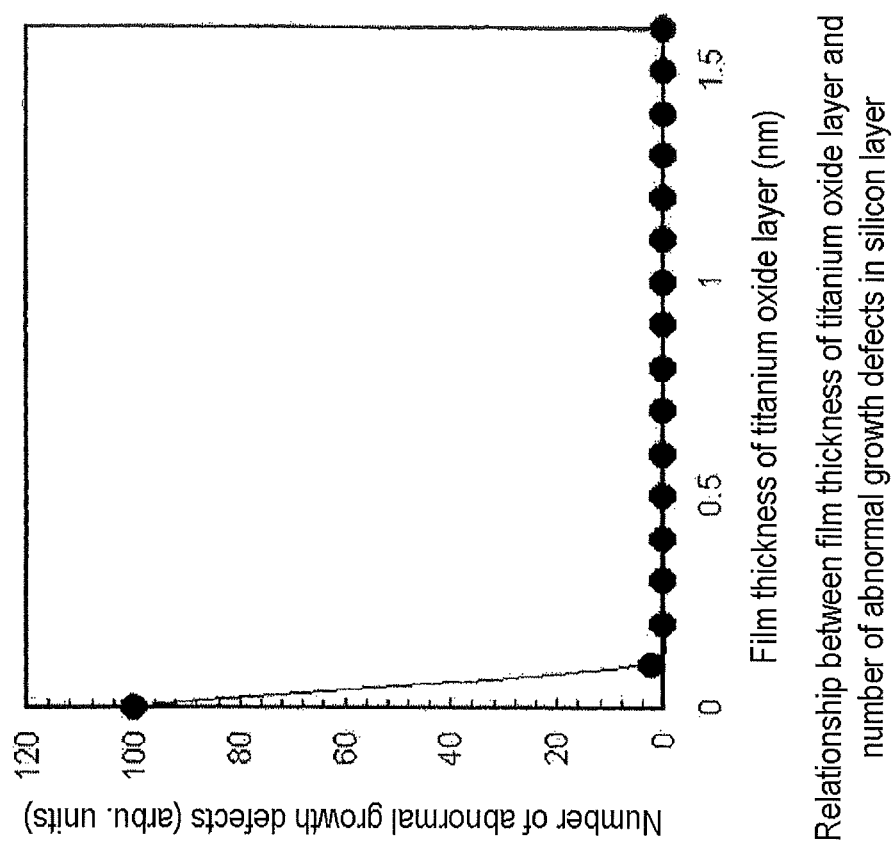
[Figure 1]
Relationship between film thickness of titanium oxide layer and number of abnormal growth defects in silicon layer

[Figure 2]
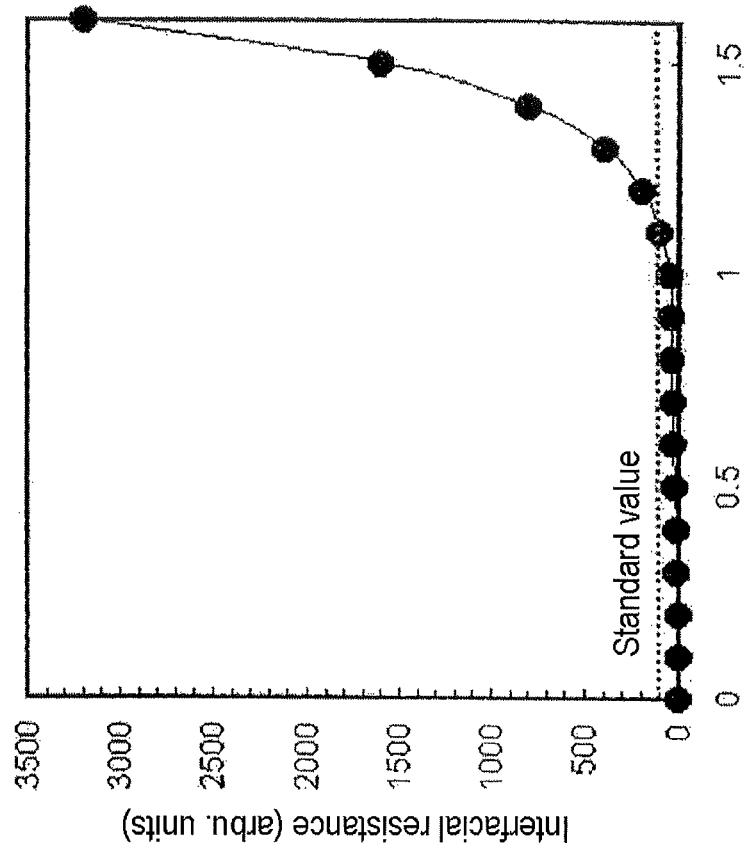

[Figure 3]
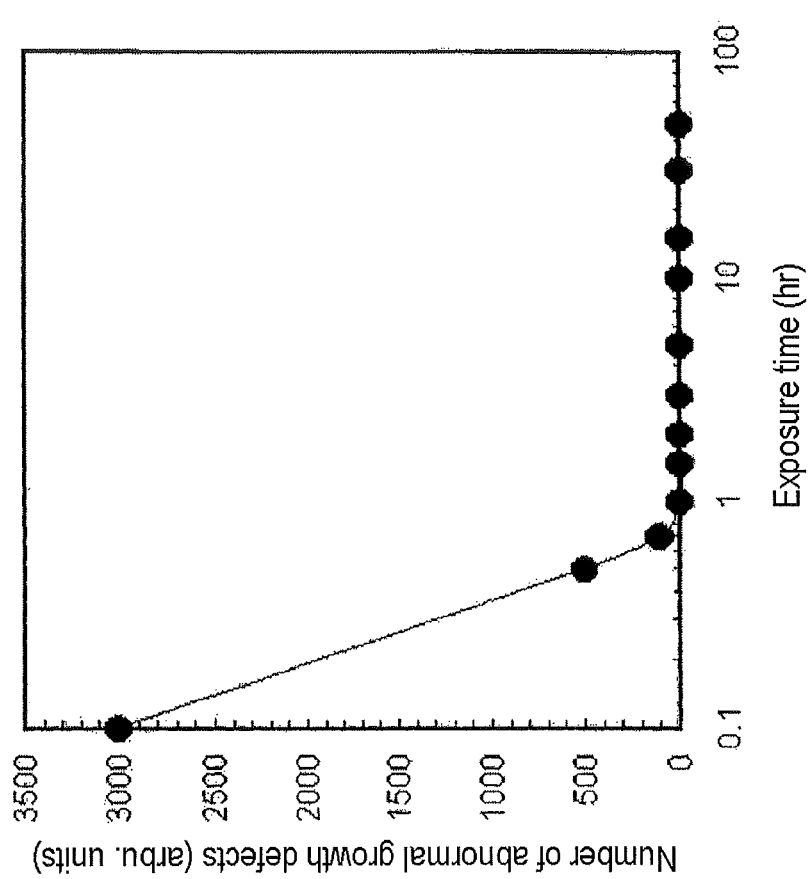

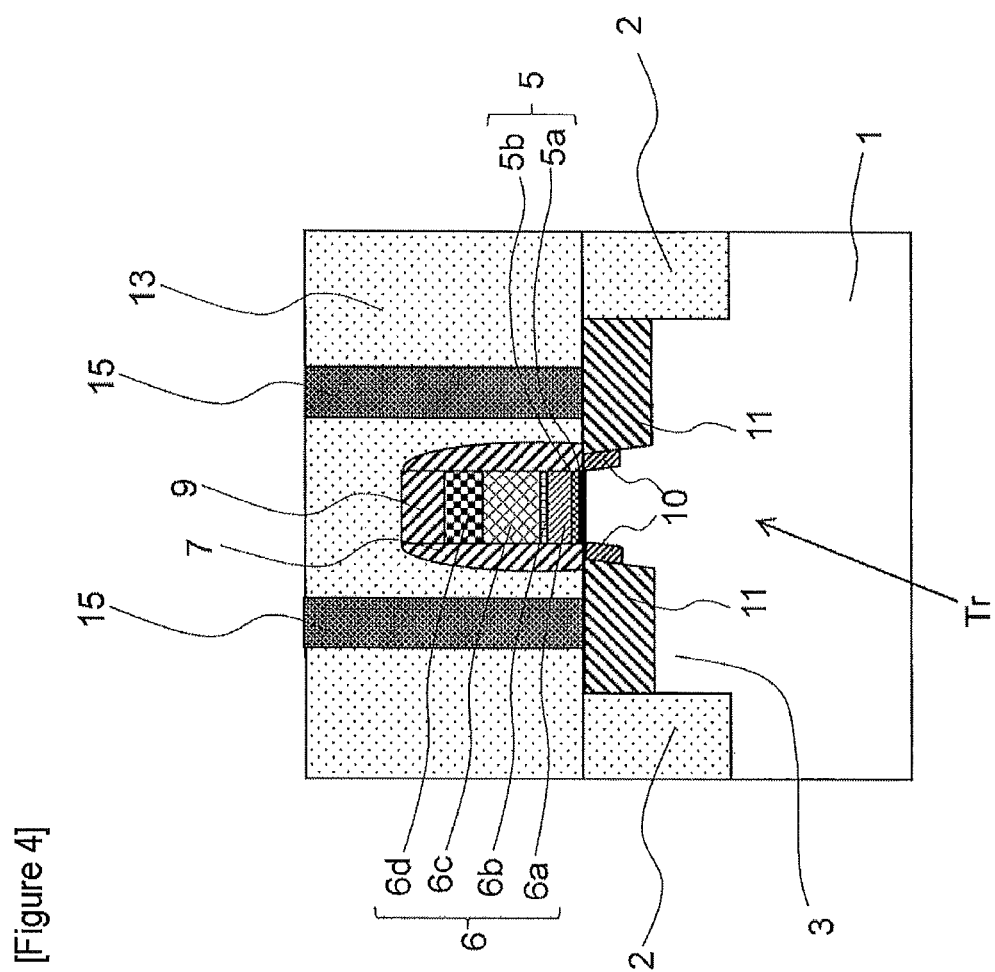
[Figure 4]

[Figure 5]
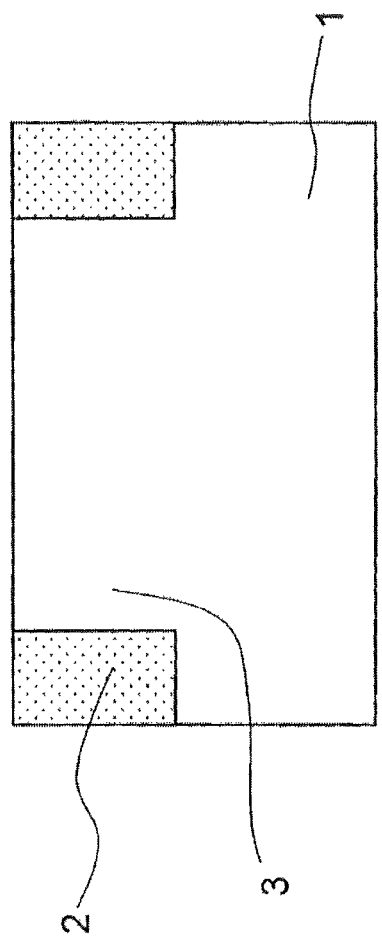

[Figure 6]
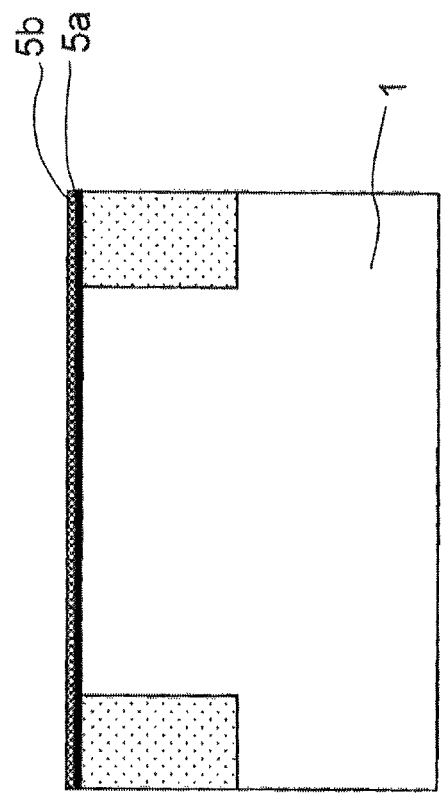

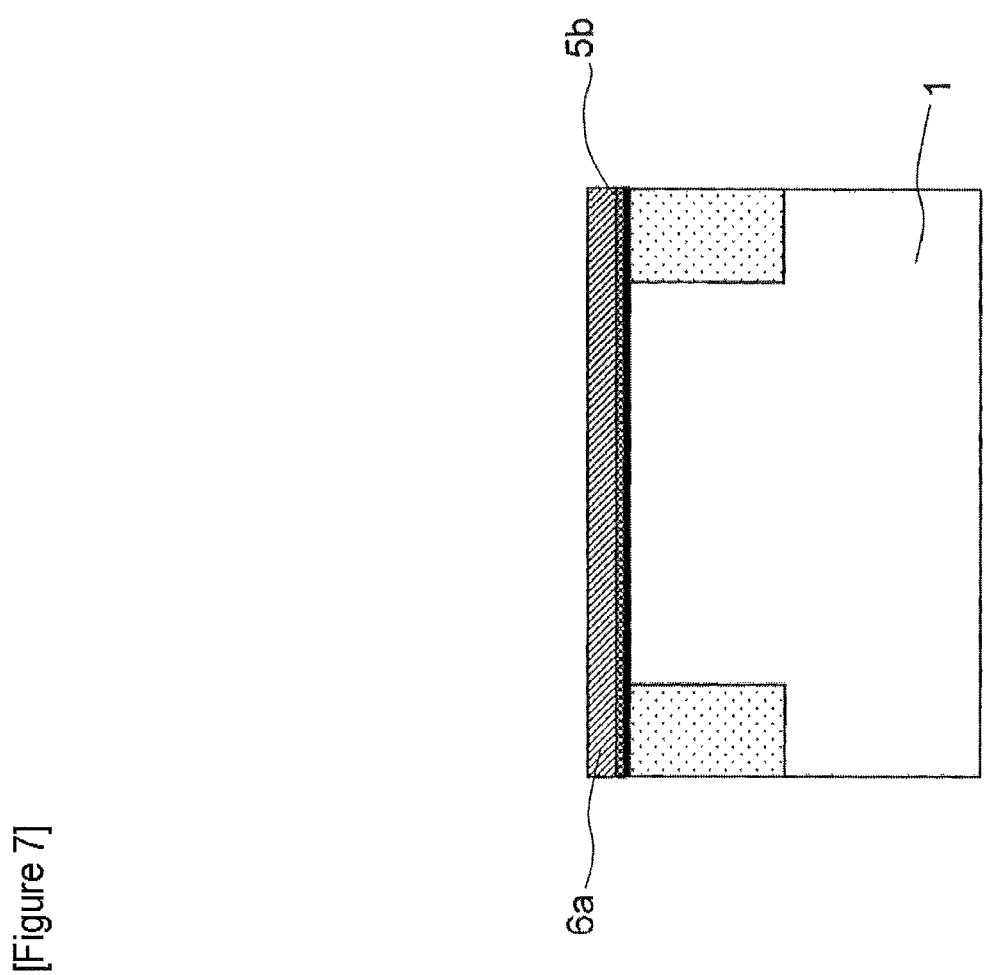
[Figure 7]

[Figure 8]
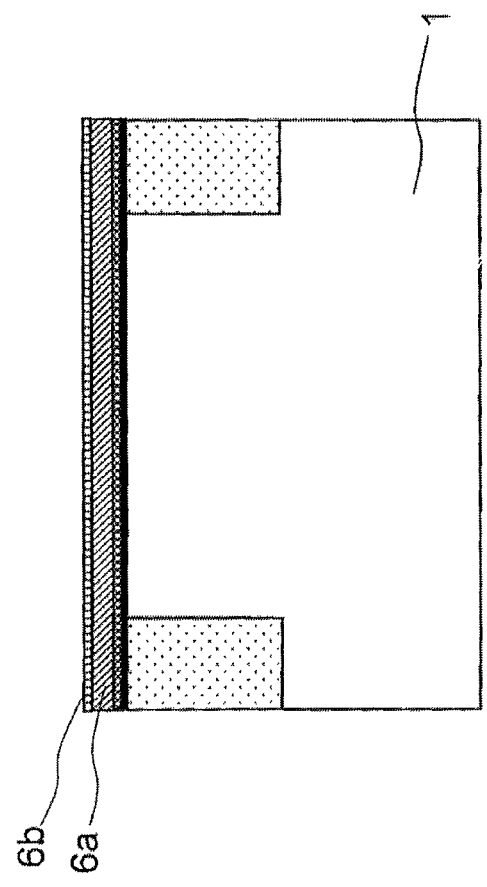

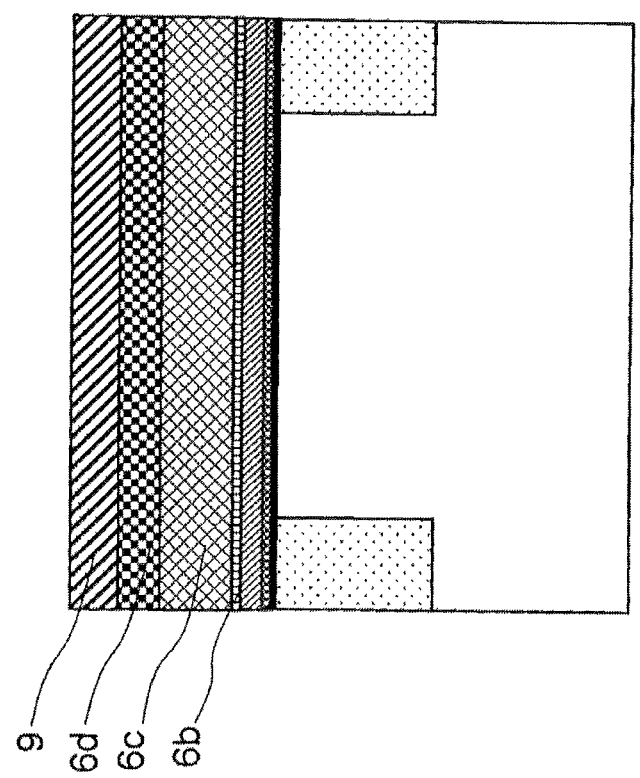
[Figure 9]

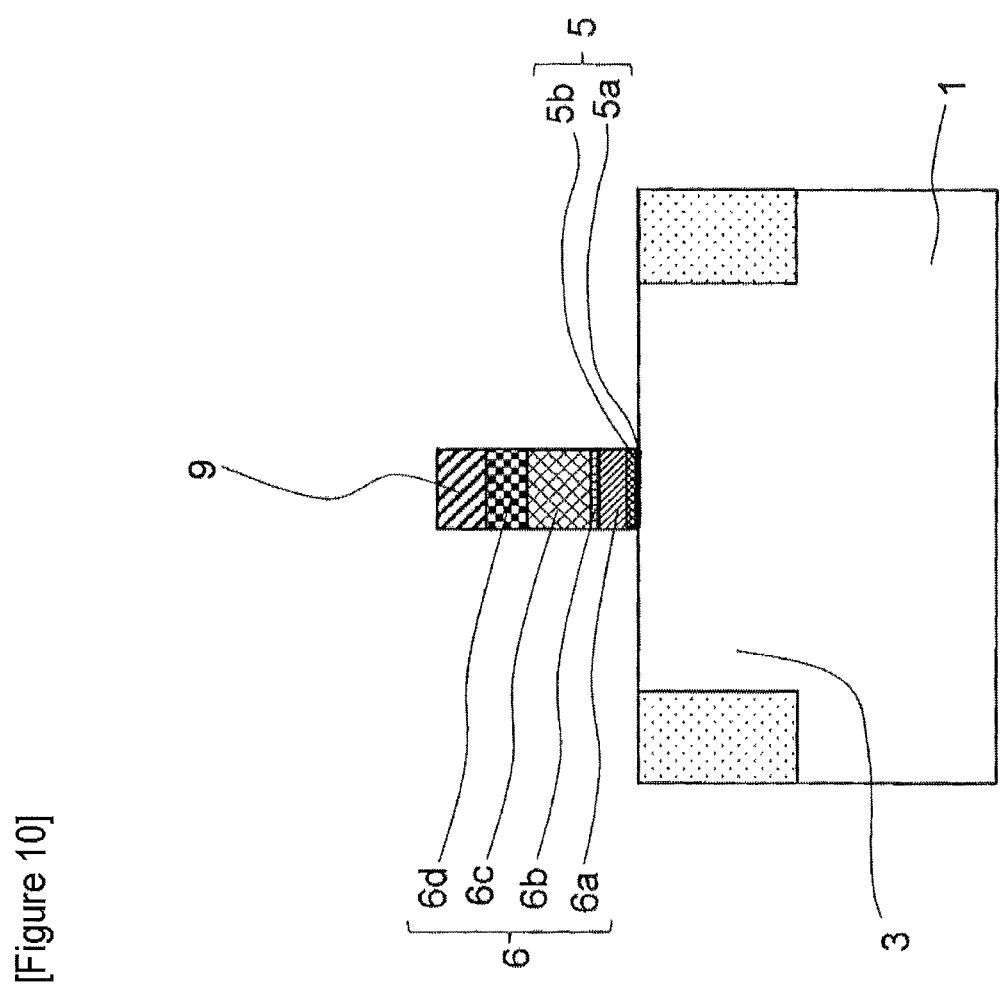

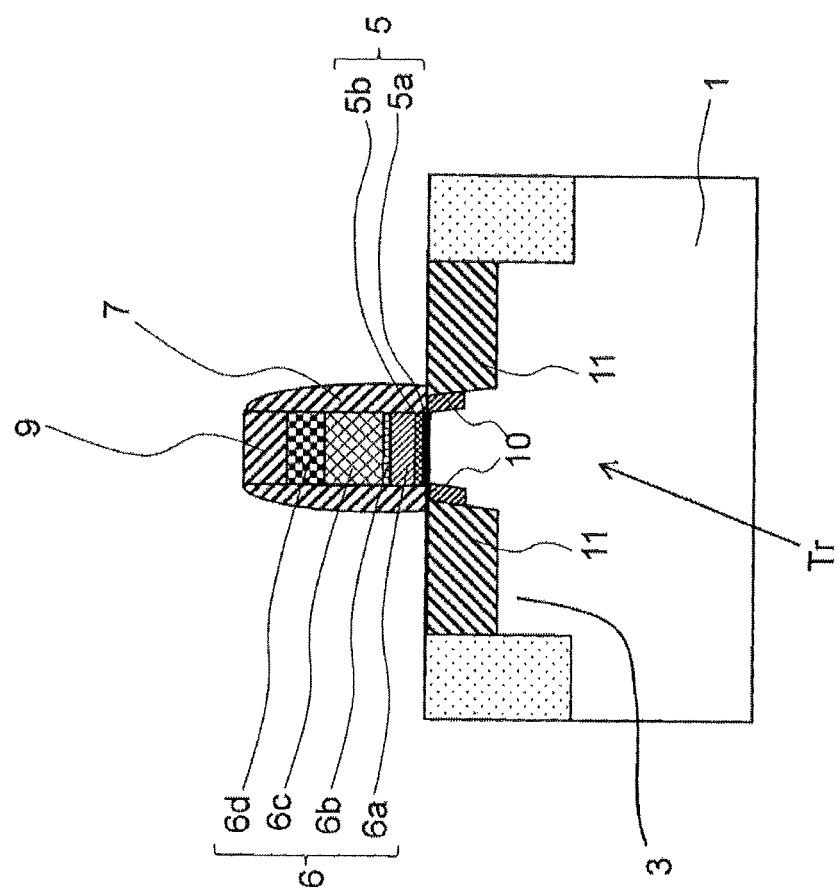
[Figure 11]

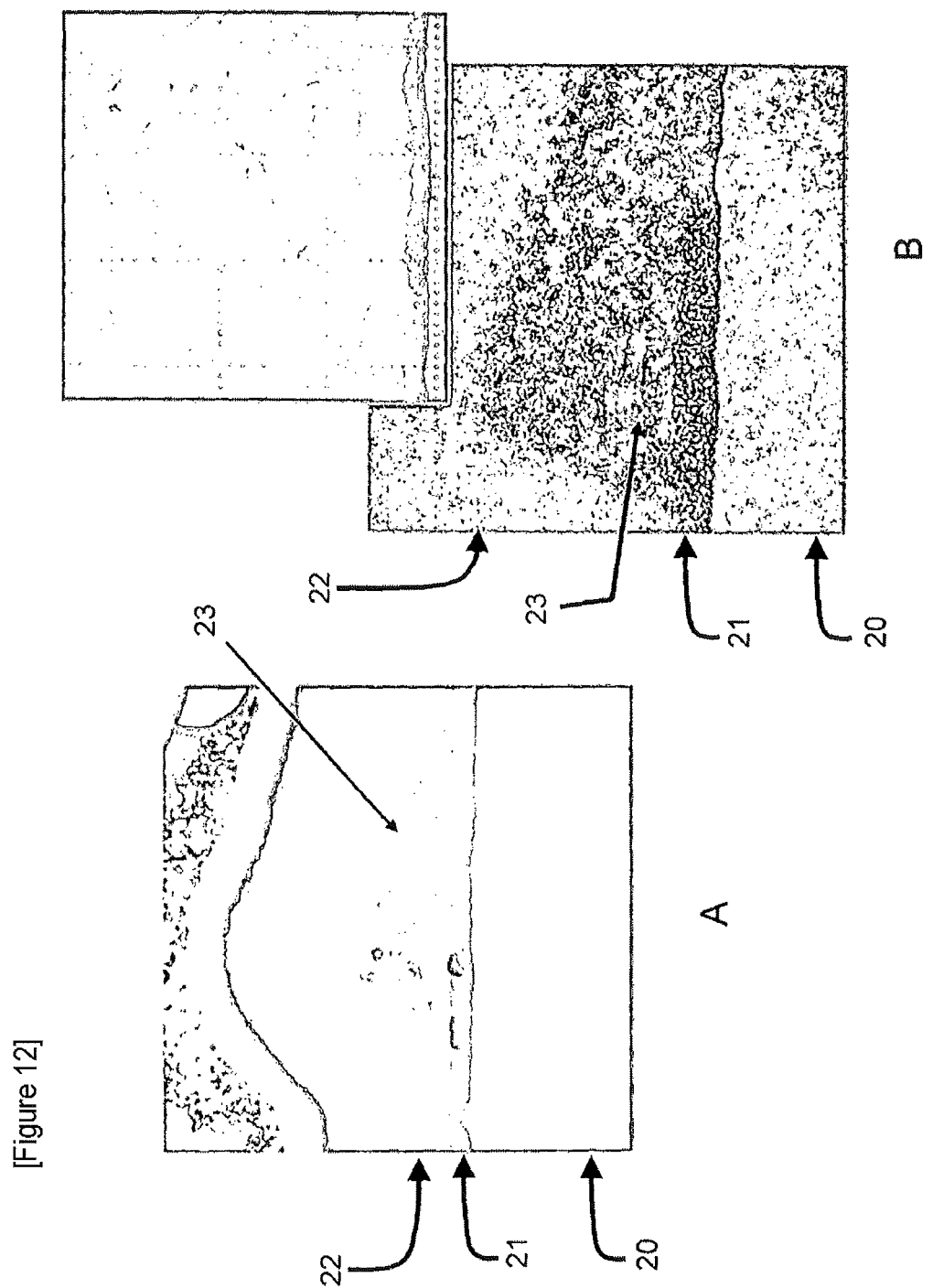
[Figure 12]

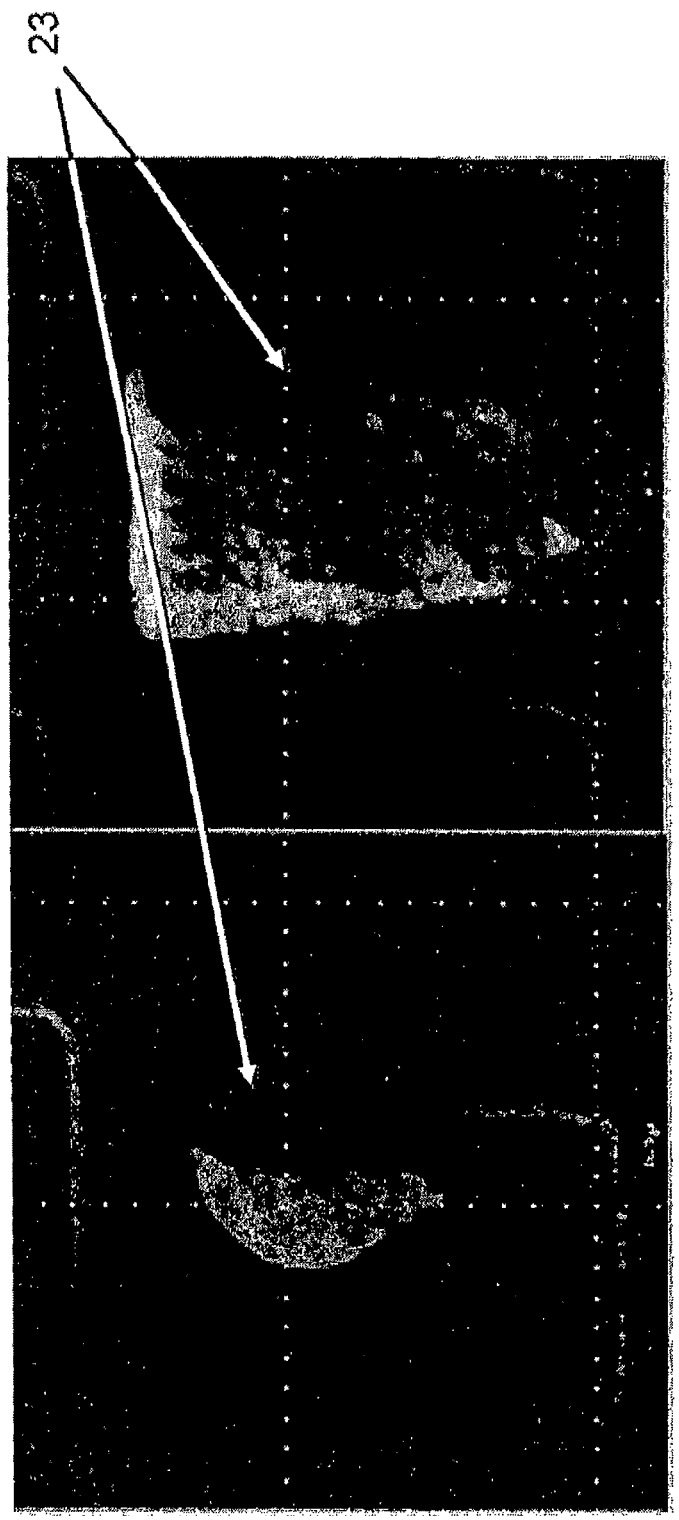
[Figure 13]

GATE ELECTRODE OF A SEMICONDUCTOR DEVICE, AND METHOD FOR PRODUCING SAME

TECHNICAL FIELD

The present invention relates to a semiconductor device and a method of manufacturing the same.

BACKGROUND ART

In the past it has been proposed to use a metal layer for the gate electrode in a transistor with which it is possible to obtain a high ON current. However the following problems arise if the gate electrode is configured using only a metal layer.
(1) Because control of the threshold voltage using the gate electrode depends on the film thickness, it is difficult using only a metal layer to achieve a thickness that can satisfy both the need for a desired threshold and a low resistance.
(2) From the point of view of ease of machining, it is problematic to arrange that the entire gate electrode comprises a metal layer.

There have thus been proposed transistors having a gate electrode employing a metal gate construction in which a silicon layer is laminated onto a metal layer.

Further, by employing this gate electrode, having a metal layer and a silicon layer, in combination with a gate insulating film having a high-dielectric constant insulating layer (high-K film) that is higher than that of a silicon oxide film, leakage currents which pass through the gate insulating film as a result of a quantum tunneling effect can be reduced, and the transistor can be effectively miniaturized and more highly integrated.

Non-patent literature article 1 (Extended Abstracts of the 2007 International Conference on Solid State Devices and Materials, Tsukuba, 2007, pp. 16-17, B. P. Linder et al.) discloses a transistor equipped with a gate insulating film comprising a high-dielectric constant insulating layer and a gate electrode comprising a metal layer.

PRIOR ART LITERATURE

Non-Patent Literature

Non-patent literature article 1: Extended Abstracts of the 2007 International Conference on Solid State Devices and Materials, Tsukuba (2007, pp. 16-17, B. P. Linder et al.)

SUMMARY OF THE INVENTION

Problems to be Resolved by the Invention

During the formation of a gate electrode having a metal gate construction, if a silicon layer is formed on a metal layer there is a tendency for polycrystallization to occur due to the effects of the crystallinity of the metal layer constituting the base layer, typified for example by its orientation. If a polycrystalline portion exists in the silicon layer in this way, abnormal growth occurs, generating irregularities in the outer surface of this portion, and problems arise in that it may not be possible to obtain the desired dimensions even if the silicon layer is machined in a subsequent process, or in that residue may be generated, for example.

FIGS. 12 and 13 are respectively a TEM (transmission electron microscope) photograph and a SEM (scanning electron microscope) photograph showing an abnormal growth condition in a silicon layer. FIG. 12 shows cross sectional views of a laminated film in which a titanium nitride layer 21 and an amorphous silicon layer 22 are formed on a silicon substrate 20, FIG. 12A being a cross sectional view in the vicinity of an interface between the titanium nitride layer 21 and the amorphous silicon layer 22, and FIG. 12B being an enlarged view of a portion of abnormal growth 23 shown in FIG. 12A. Also, FIG. 13 shows the condition of the outer surface of the amorphous silicon layer 22. As illustrated in FIG. 12 and FIG. 13, polycrystalline portions exist locally as portions of abnormal growth 23 in the vicinity of the boundary between the titanium nitride layer 21 and the amorphous silicon layer 22, and irregularities occur on the amorphous silicon layer 22.

Accordingly, as methods of suppressing such abnormal growth of the silicon layer, it is conceivable to reduce the silicon layer deposition temperature, or to reduce the crystallinity of the metal layer. However, reducing the silicon layer deposition temperature causes problems in that the silicon layer deposition speed is reduced, resulting in a reduction in productivity. Also, reducing the crystallinity of the metal layer is problematic in that it causes the transistor performance to deteriorate. It is therefore difficult to control the conditions to allow abnormal growth of the silicon layer to be suppressed while at the same time improving the performance of the transistor. It has thus been a challenge to form a metal gate construction equipped with a silicon layer which does not depend on the crystallinity of the metal layer, without lowering the silicon layer deposition temperature.

Means of Overcoming the Problems

One mode of embodiment relates to a semiconductor device comprising:
a semiconductor substrate;
a gate insulating film provided on the abovementioned semiconductor substrate;
a gate electrode having a metal layer, a metal oxide layer and a silicon layer containing a dopant, provided sequentially on the abovementioned gate insulating film; and
a transistor having the abovementioned gate insulating film and the gate electrode.

Another mode of embodiment is a method of manufacturing a semiconductor device, provided with
a step in which a gate insulating film is formed on a semiconductor substrate,
a step in which a metal layer is formed on the abovementioned gate insulating film,
a step in which a metal oxide layer is formed on the abovementioned metal layer,
a step in which an amorphous silicon layer containing a dopant is formed on the abovementioned metal oxide layer, and
a step in which a gate electrode is formed by patterning the abovementioned metal layer, the metal oxide layer and the abovementioned amorphous silicon layer.

Advantages of the Invention

It is possible to provide a semiconductor device in which abnormal growth is suppressed, and which is equipped with a gate electrode capable of being machined in a miniaturized form. As a result it is possible to provide a semiconductor device which can support miniaturization without degradation of the device characteristics.

BRIEF EXPLANATION OF THE DRAWINGS

FIG. 1 is a chart showing the relationship between the film thickness of a titanium oxide layer and the number of abnormal growth defects in a silicon layer.

FIG. 2 is a chart showing the relationship between the film thickness of a titanium oxide layer and the interfacial resistance between a titanium nitride layer and a silicon layer.

FIG. 3 is a chart showing the relationship between the time a sample is exposed to the atmosphere and the number of abnormal growth defects in a silicon layer.

FIG. 4 is a cross sectional view used to explain a method of manufacturing a semiconductor device according to a first embodiment.

FIG. 5 is a cross sectional view used to explain a method of manufacturing a semiconductor device according to a first embodiment.

FIG. 6 is a cross sectional view used to explain a method of manufacturing a semiconductor device according to a first embodiment.

FIG. 7 is a cross sectional view used to explain a method of manufacturing a semiconductor device according to a first embodiment.

FIG. 8 is a cross sectional view used to explain a method of manufacturing a semiconductor device according to a first embodiment.

FIG. 9 is a cross sectional view used to explain a method of manufacturing a semiconductor device according to a first embodiment.

FIG. 10 is a cross sectional view used to explain a method of manufacturing a semiconductor device according to a first embodiment.

FIG. 11 is a cross sectional view used to explain a method of manufacturing a semiconductor device according to a first embodiment.

FIG. 12 is a TEM photograph in which an image of a portion of abnormal growth in a silicon layer has been captured.

FIG. 13 is a SEM photograph in which an image of a portion of abnormal growth in a silicon layer has been captured.

MODES OF EMBODYING THE INVENTION

One example of the semiconductor device of the present invention is equipped with a transistor having a gate electrode having a metal layer, a metal oxide layer and a silicon layer containing a dopant, provided sequentially on a gate insulating film. By providing a metal oxide layer on a metal layer, and further providing a silicon layer thereon in this way it is possible when forming the silicon layer for abnormal growth in the silicon layer to be suppressed effectively, without being subjected to the adverse effects due to the crystallinity of the metal layer, for example its orientation. As a result it is possible to provide a semiconductor device equipped with a gate electrode capable of being machined in a miniaturized form. It is also possible to provide a semiconductor device which can support miniaturization without degradation of the device characteristics.

FIG. 1 is a chart showing the relationship between the film thickness of a titanium oxide layer and the number of abnormal growth defects in a silicon layer. The samples in FIG. 1 were prepared as follows. First a titanium nitride layer having a film thickness of 15 nm was deposited on a semiconductor substrate. Then, for the sample having a titanium oxide layer with a film thickness of 0 nm, a silicon layer having a film thickness of 80 nm was immediately formed on the titanium nitride layer at a deposition temperature of 500° C. For the other samples, after deposition of the titanium nitride layer, the samples were exposed to the atmosphere for 1 to 48 hours to allow a titanium oxide layer, to form on the outer surface of the titanium nitride layer. The film thickness of the titanium oxide layer was controlled by adjusting the time of exposure of the sample to the atmosphere. In other words, by reducing the time of exposure of the sample to the atmosphere, the film thickness of the titanium oxide layer can be reduced, and by increasing the time of exposure of the sample to the atmosphere, the film thickness of the titanium oxide layer can be increased. The outer surface and the cross section of the silicon layer formed in this way were observed using a transmission electron microscope (TEM), and the presence or absence of abnormal growth defects was determined.

As can be seen from the results in FIG. 1, the number of abnormal growth defects in the silicon layer was 100 when no titanium oxide layer was provided (film thickness 0 nm), whereas the number of abnormal growth defects in a sample provided with a titanium oxide layer having a film thickness of approximately 0.1 nm was less than 4, and it can further be seen that the number of abnormal growth defects in samples provided with a titanium oxide layer having a film thickness of approximately 0.2 nm or more was zero.

FIG. 2 is a chart showing the relationship between the film thickness of a titanium oxide layer and the interfacial resistance between a titanium nitride layer and a silicon layer. The samples in FIG. 2 were prepared in the same way as in FIG. 1, the film thickness of the titanium oxide layer being controlled in the same way as in FIG. 1 by adjusting the time of exposure of the sample to the atmosphere. As shown in FIG. 2, it can be seen that the interfacial resistance tends to increase as the film thickness of the titanium oxide layer increases. In order to be able to operate a transistor stably up to high frequencies and to obtain satisfactory transistor characteristics, it is preferable for the interfacial resistance to be less than a standard value of 100, shown by the dotted line in FIG. 2. Based on FIG. 2, in order to obtain such an interfacial resistance, the film thickness of the titanium oxide layer should preferably be 1 nm or less.

As discussed hereinabove, from the results in FIG. 1 and FIG. 2 it can be seen that abnormal growth defects in the silicon layer can be suppressed by providing a silicon oxide layer between the titanium nitride layer and the silicon layer. Further, it can be seen that the film thickness of the titanium oxide layer should preferably be 0.1 to 1 nm, this being a film thickness with which abnormal growth defects do not readily occur and with which the interfacial resistance is small.

FIG. 3 is a chart showing the relationship between the time a sample is exposed to the atmosphere and the number of abnormal growth defects in a silicon layer. The samples in FIG. 3 were prepared in the same way as in FIG. 1. As shown in FIG. 3, it can be seen that if the sample exposure time is less than 1 hour, the number of abnormal growth defects in the silicon layer is approximately 100 to 3,000, and because a stable titanium oxide layer is not formed, abnormal growth occurs in the silicon layer. On the other hand, it can be seen that if the sample exposure time is 1 hour or more, the number of abnormal growth defects in the silicon layer is zero, and abnormal growth does not occur in the silicon layer. It can therefore be seen that when forming the titanium oxide layer by exposing the sample to the atmosphere, the exposure time should preferably be one hour or more. It should be noted that conventionally, in the process of forming a transistor having a metal gate construction, a sample would not be exposed to the atmosphere for one hour or more after formation of the metal layer, for reasons such as improving productivity. Thus in a conventional method of manufacturing a transistor, a metal oxide layer does not form during formation of the gate electrode.

Further, a description has been given using FIGS. 1 to 3 of a case in which a titanium oxide layer is formed as a metal oxide layer on a titanium nitride layer, which is a metal layer, and a silicon layer is further formed thereon. However, even if another metal oxide layer is formed on another metal layer, the relationships between the film thickness of the metal oxide layer, the number of abnormal growth defects in the silicon layer, the interfacial resistance between the metal layer and the silicon layer, and the time of exposure of the metal layer to the atmosphere exhibit the same tendencies as in FIGS. 1 to 3. It is thus preferable for the film thickness of the metal oxide layer to be 0.1 to 1 nm.

It should be noted that the types of the metal layer and the metal oxide layer provided on the outer surface thereof are not particularly restricted, but it is preferable to form a titanium nitride layer, a tungsten layer or a ruthenium layer as the metal layer. Further, it is preferable to form a titanium oxide layer, a tungsten oxide layer or a ruthenium oxide layer as the metal oxide layer. The metal layer may have a laminated construction comprising layers of a plurality of types of metal.

A semiconductor device and a method of manufacturing the same, being an embodiment of the present invention, will now be described with reference to FIGS. 4 to 11. This embodiment is a specific example illustrated to provide a more in-depth understanding of the present invention, and the present invention is not in any way restricted to this specific example. Further, the same reference codes are assigned to the same members, and explanations thereof are omitted or simplified. Further, reference codes are omitted as appropriate for the same member. It should be noted that the drawings used in the following explanation are schematic, and the ratios between length, width and thickness, for example, are not necessarily the same as would actually be the case. In the following embodiment, conditions such as materials and dimensions that are shown specifically are merely shown by way of example.

First Embodiment

FIG. 4 is a cross sectional view illustrating a semiconductor device according to the present embodiment. As shown in FIG. 4, an active region 3 is provided within a semiconductor substrate 1 in such a way that it is demarcated by an element isolation region 2. A gate insulating film 5 and a gate electrode 6 are provided on the active region 3. The gate insulating film 5 comprises a silicon oxide layer 5a and a hafnium oxide ($HfO_2$) layer 5b, being a high-dielectric constant insulating layer (high-k film) having a dielectric constant that is higher than that of silicon oxide, provided sequentially on the semiconductor substrate 1. The gate electrode 6 comprises a titanium nitride layer 6a, a titanium oxide layer 6b, a silicon layer 6c, and a tungsten nitride layer and a tungsten layer 6d, provided sequentially on the gate insulating film 5. Side walls 7 comprising silicon nitride are provided in a pair on the respective side walls of the gate electrode 6, and a cap insulating film 9 comprising silicon nitride is provided on the upper surface of the gate electrode 6. An interlayer insulating film 13 is provided on the semiconductor substrate 1.

One pair of LDD layers 10 and high-concentration dopant regions 11 is provided within the active region 3, these layers constituting a source and a drain. Contact plugs 15 are provided penetrating through the interlayer insulating film 13 so as to reach the high-concentration dopant regions 11.

The active region 3, the gate insulating film 5, the gate electrode 6, the LDD layers 10 and the high-concentration dopant regions 11 constitute a transistor Tr.

In the present embodiment, by providing a gate electrode 6 having a laminated construction comprising the titanium nitride layer 6a, the titanium oxide layer 6b and the silicon layer 6c, abnormal growth during formation of the silicon layer 6c can be suppressed. As a result, deterioration of the performance of a semiconductor device equipped with the transistor can be suppressed.

The material used for the gate insulating film 5b is not restricted to being hafnium oxide, and there is no particular restriction provided that it is a high-dielectric constant insulating layer (high-k film) having a dielectric constant that is higher than that of silicon oxide. It is for example possible to use one or more insulating materials selected from the group comprising HfSiON, $ZrO_2$, $Ta_2O_5$, $Nb_2O_5$, $Al_2O_3$, $HfO_2$, $ScO_3$, $Y_2O_3$, $La_2O_3$, $CeO_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$. A laminated film comprising a plurality of layers containing these materials may also be used.

FIGS. 4 to 11 are drawings used to explain a method of manufacturing the semiconductor device of the present embodiment. First, as illustrated in FIG. 5, channels for the element isolation regions are formed on the semiconductor substrate 1 using a lithographic technique and a dry etching technique. After insulating films have been embedded within these channels using a CVD method, the insulating films are planarized using CMP or etch-back, forming element isolation regions 2. By this means an active region 3 is formed in such a way that it is demarcated by the element isolation regions 2. A well is formed in a prescribed region within the active region 3 by injecting a prescribed conduction-type dopant. Natural oxide films and the like are then removed by treating the outer surface of the semiconductor substrate with an aqueous solution of hydrogen fluoride (HF).

As illustrated in FIG. 6, a silicon oxide layer 5a having a film thickness of 2 nm is formed on the semiconductor substrate 1 by thermal oxidation using a lamp annealer. A hafnium oxide layer 5b having a film thickness of 2 nm is then formed on the silicon oxide layer 5a using a CVD (Chemical Vapor Deposition) method.

As illustrated in FIG. 7, the semiconductor substrate 1 is introduced into a deposition chamber of a sputtering device, and a titanium nitride layer 6a having a film thickness of 2 to 5 nm is formed on the hafnium oxide layer 5b using a sputtering method.

As illustrated in FIG. 8, a titanium oxide layer 6b having a film thickness of 0.1 to 1 nm is formed by oxidizing the outer surface of the titanium nitride layer 6a to convert it into the titanium oxide layer 6b. The following methods (1) to (3) can be mentioned by way of example as methods for oxidizing the outer surface of the titanium nitride layer 6a.

(1) Expose the semiconductor substrate 1 provided with the titanium nitride layer 6a to the atmosphere for 1 hour or more.

(2) As a continuation of the process in FIG. 7, introduce oxygen gas into the deposition chamber of the sputtering device while keeping the semiconductor substrate 1, provided with the titanium nitride layer 6a, in the deposition chamber.

(3) Introduce the semiconductor substrate 1 provided with the titanium nitride layer 6a into a deposition chamber of a CVD device for forming a silicon layer, and introduce oxygen gas into the deposition chamber.

As illustrated in FIG. 9, an amorphous silicon layer 6c containing a dopant and having a film thickness of 20 to 80 nm is formed on the titanium oxide layer 6b using a CVD method. It should be noted that the dopant may be introduced when the amorphous silicon layer is deposited, using a CVD method which employs a feed gas containing the dopant, or it may be introduced by injecting the dopant into the amorphous silicon layer after the amorphous silicon layer has been deposited. Further, the amorphous silicon layer 6c may remain in an amorphous state until completion of the semiconductor device, or it may be converted into a polysilicon layer by heat treating the amorphous silicon layer 6c in a subsequent process. In the present embodiment, the amorphous silicon layer 6c is formed after the titanium oxide layer 6b has been provided on the titanium nitride layer 6a. It is thus possible to effectively prevent abnormal growth, caused by localized conversion of the amorphous silicon layer 6c into polysilicon (polycrystallization) due to the effects of the crystallinity of the titanium nitride layer 6a. As a result, a deterioration in the machining characteristics due to abnormal growth of the amorphous silicon layer 6c can be suppressed, while at the same time miniaturization can also be adequately supported. Further, the deposition temperature of the amorphous silicon layer 6c can be set to a relatively high temperature (for example 500° C.), and so high productivity can be maintained. In addition, it is not necessary to reduce the crystallinity of the metal layer, and thus degradation of the device characteristics can be prevented.

Next, a tungsten nitride layer and a tungsten layer 6d are formed on the amorphous silicon layer 6c using a sputtering method. A cap insulating film 9 comprising silicon nitride is then formed on the tungsten nitride layer and the tungsten layer 6d using a CVD method.

As illustrated in FIG. 10, a hard mask pattern is formed by patterning the cap insulating film 9 using a lithographic technique and a dry etching technique. The tungsten nitride layer and the tungsten oxide layer 6d, the amorphous silicon layer 6c, the titanium oxide layer 6b, the titanium nitride layer 6a, the hafnium oxide layer 5b and the silicon oxide layer 5a are sequentially patterned using the hard mask pattern, to form the gate insulating film 5, the gate electrode 6 and the cap insulating film 9 on the active region 3.

As illustrated in FIG. 11, the LDD layers 10 are formed by injecting a dopant into the active region 3. After depositing a silicon nitride layer over the entire semiconductor substrate 1 using a CVD method, the silicon nitride layer is etched back to form the side walls 7 on the side surfaces of the gate electrode 6. Next, the high-concentration dopant regions 11 are formed by injecting a high-concentration dopant into the active region 3. By this means a transistor Tr having an active region 3, a gate insulating film 5, a gate electrode 6, LDD layers 10 and high-concentration dopant regions 11 is completed.

As illustrated in FIG. 4, after a coating-type interlayer insulating film (Spin On Dielectric) 13 has been formed on the semiconductor substrate 1, it is planarized using CMP. Contact holes exposing the high-concentration dopant regions 11 are formed in the interlayer insulating film 13 using a lithographic technique and a dry etching technique. A tungsten film (metal layer) is formed over the entire semiconductor substrate 1 using a sputtering method such that the contact holes are filled. Contact plugs 15 connected to the high-concentration dopant regions 11 are formed by removing the tungsten film on the interlayer insulating film 13 using a CMP method.

EXPLANATION OF THE REFERENCE NUMBERS

1 Semiconductor substrate
2 Element isolation region
3 Active region
5 Gate insulating film
5a Silicon oxide layer
5b Hafnium oxide layer
6 Gate electrode
6a Titanium nitride layer
6b Titanium oxide layer
6c Silicon layer
6d Tungsten nitride layer and tungsten layer
7 Side wall
9 Cap insulating film
10 LDD layer
11 High-concentration dopant region
13 Interlayer insulating film
15 Contact plug
20 Silicon substrate
21 Titanium nitride layer
22 Amorphous silicon layer
23 Portion of abnormal growth

The invention claimed is:

1. A semiconductor device comprising:
   a semiconductor substrate;
   a gate insulating film provided on the semiconductor substrate;
   a gate electrode including a metal layer, a metal oxide layer and a silicon layer containing a dopant formed directly on the metal oxide layer, provided sequentially on the gate insulating film; and
   a transistor including the gate insulating film and the gate electrode.

2. The semiconductor device as claimed in claim 1, wherein a film thickness of the metal oxide layer is 0.1 to 1.1 nm.

3. The semiconductor device as claimed in claim 1 wherein the metal layer comprises a titanium nitride layer, a tungsten layer or a ruthenium layer.

4. The semiconductor device as claimed in claim 1 wherein the metal oxide layer comprises a titanium oxide layer, a tungsten oxide layer or a ruthenium oxide layer.

5. The semiconductor device as claimed in claim 1, wherein the silicon layer is an amorphous silicon layer or a polysilicon layer.

6. The semiconductor device as claimed in claim 1, wherein the gate electrode further comprises a tungsten nitride layer and a tungsten layer provided sequentially on the silicon layer.

7. The semiconductor device as claimed in claim 1, wherein the gate insulating film comprises a silicon oxide layer provided on the semiconductor substrate, and a high-dielectric constant insulating layer provided on the silicon oxide layer.

8. The semiconductor device as claimed in claim 1, wherein the high-dielectric constant insulating layer contains one or more insulating materials selected from the group comprising HfSiON, $ZrO_2$, $Ta_2O_5$, $Nb_2O_5$, $Al_2O_3$, $HfO_2$, $ScO_3$, $Y_2O_3$, $La_2O_3$, $CeO_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$.

9. A method of manufacturing a semiconductor device, comprising:
forming a gate insulating film on a semiconductor substrate,
forming a metal layer on the gate insulating film,
forming a metal oxide layer on the metal layer,
forming an amorphous silicon layer containing a dopant directly on the metal oxide layer, and
forming a gate electrode by patterning the metal layer, the metal oxide layer and the amorphous silicon layer.

10. The method of manufacturing a semiconductor device as claimed in claim 9, wherein a film thickness of the metal oxide layer is 0.1 to 1 nm.

11. The method of manufacturing a semiconductor device as claimed in claim 9, wherein the forming of the metal oxide layer comprises the oxidizing the outer surface of the metal layer in an atmosphere containing oxygen.

12. The method of manufacturing a semiconductor device as claimed in claim 9, wherein the metal layer comprises a titanium nitride layer, a tungsten layer or a ruthenium layer.

13. The method of manufacturing a semiconductor device as claimed in claim 9, wherein the metal oxide layer comprises a titanium oxide layer, a tungsten oxide layer or a ruthenium oxide layer.

14. The method of manufacturing a semiconductor device as claimed in claim 9, further comprising, after the forming of the amorphous silicon layer, heat-treating the amorphous silicon layer to convert the amorphous silicon layer into a polysilicon layer.

15. The method of manufacturing a semiconductor device as claimed in claim 9, further comprising, after the forming of the amorphous silicon layer, forming a tungsten nitride layer on the amorphous silicon layer, and forming a tungsten layer on the tungsten nitride layer.

16. The method of manufacturing a semiconductor device as claimed in claim 9, wherein the forming of the gate insulating film comprises forming a silicon oxide layer on the semiconductor substrate, and forming a high-dielectric constant insulating layer on the silicon oxide layer.

17. The method of manufacturing a semiconductor device as claimed in claim 9, wherein the high-dielectric constant insulating layer contains one or more insulating materials selected from the group comprising HfSiON, $ZrO_2$, $Ta_2O_5$, $Nb_2O_5$, $Al_2O_3$, $HfO_2$, $ScO_3$, $Y_2O_3$, $La_2O_3$, $CeO_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$.

* * * * *